(12) United States Patent
Takahashi

(10) Patent No.: US 7,855,402 B2
(45) Date of Patent: Dec. 21, 2010

(54) COMPOUND SEMICONDUCTOR DEVICE AND METHOD FOR FABRICATING THE SAME

(75) Inventor: Tsuyoshi Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 180 days.

(21) Appl. No.: 11/976,650

(22) Filed: Oct. 26, 2007

(65) Prior Publication Data

US 2008/0121935 A1    May 29, 2008

(30) Foreign Application Priority Data

Nov. 29, 2006    (JP) .............................. 2006-322228

(51) Int. Cl.
*H01L 29/739*    (2006.01)

(52) U.S. Cl. .................. 257/194; 257/192; 257/189; 257/E29.246

(58) Field of Classification Search .................. 257/194, 257/20, 192, 189, E29, 246, E21, 403
See application file for complete search history.

(56) References Cited

U.S. PATENT DOCUMENTS 5,677,553 A * 10/1997 Yamamoto et al. .......... 257/192

2002/0139994 A1* 10/2002 Imanishi ...................... 257/194

FOREIGN PATENT DOCUMENTS

| JP | 8-55979 | 2/1996 |
| JP | 9-139494 | 5/1997 |
| JP | 11-214676 | 8/1999 |

* cited by examiner

*Primary Examiner*—Thinh T Nguyen
(74) *Attorney, Agent, or Firm*—Kratz, Quintos & Hanson, LLP

(57) ABSTRACT

In a HEMT with a spacer layer composed of a 3 nm-thick intrinsic InAlAs layer, a supply layer composed of a 4 nm-thick n-type InAlAs layer, and a barrier layer composed of a 5 nm-thick intrinsic InAlAs layer, the spacer layer and supply layer exist between a channel layer and a planar-doped layer and the total thickness of these layers is approximately 7 nm. For this reason, the impurity (Si) in the planar-doped layer never diffuses into the channel layer, making available an excellent low-noise characteristic. In addition, since an intrinsic semiconductor layer is used as the barrier layer, it is possible to obtain an adequate gate withstand voltage even if the barrier layer is made thinner. It is therefore possible to cancel the degradation of the transconductance gm by thinning the barrier layer.

12 Claims, 13 Drawing Sheets

COMPOUND SEMICONDUCTOR DEVICE AND METHOD FOR FABRICATING THE SAME

CROSS-REFERENCE TO RELATED APPLICATIONS

This application is based upon and claims the benefit of priority from the prior Japanese Patent Application No. 2006-322228, filed on Nov. 29, 2006, the entire contents of which are incorporated herein by reference.

BACKGROUND OF THE INVENTION

1. Field of the Invention

The present invention relates to a compound semiconductor device used, for example, for monolithic microwave integrated circuits (MMIC) and to a method for fabricating the device.

2. Description of the Related Art

In recent years, a high electron mobility transistor (HEMT) has come into use for high-speed digital circuits, such as the signal processing circuits of optical communications systems, from the viewpoint of a high-speed characteristic. Also from the viewpoint of a low-noise characteristic, the HEMT is expected to be applied to low-noise amplifiers used in a microwave or millimeter wave band. InP and GaAs are used mainly as materials for the HEMT, thus providing the HEMT in the form of a heterojunction field-effect transistor.

In a previous HEMT, an n-type impurity was uniformly doped into an electron supply layer. In recent years however, a technique for planar-doping silicon (Si) or other materials into the electron supply layer has been frequently used in order to improve the high-speed characteristic. Such a technique is disclosed in, for example, Patent Document 1 (Japanese Patent Application Laid-Open No. Hei 9-139494). FIG. 9 is a cross-sectional view illustrating the structure of a conventional compound semiconductor device.

In a conventional compound semiconductor device, an intrinsic InAlAs layer 102 is selectively formed on an InP substrate 101, and then an intrinsic InGaAs layer 103, an intrinsic InAlAs layer 104, a Si planar-doped layer 106 and an intrinsic InAlAs layer 107 are successively stacked on the intrinsic InAlAs layer 102. Then, n-type InGaAs layers 108 are formed in two places on the intrinsic InAlAs layer 107, and then a source electrode 109S and a drain electrode 109D are formed on the n-type InGaAs layers 108, respectively. In addition, a gate electrode 110 is formed in an area between the source electrode 109S and the drain electrode 109D on the intrinsic InAlAs layer 107.

In this structure, the Si planar-doped layer 106 is provided in a location where an n-type InAlAs layer used to be provided as an electron supply layer. According to such a structure, it is possible to improve the transconductance gm and keep the carrier concentration Ns sufficiently high, compared with the previous compound semiconductor device, thereby improving the high-speed characteristic. However, the high-speed characteristic available with this structure is not adequate, either.

Generally speaking, it is possible to improve the transconductance gm further by increasing the concentration of an impurity in the Si planar-doped layer 106. However, increasing the concentration results in an increase in the amount of impurity diffusing into the channel, causing the impurity to serve as a source of electron scattering. As a result, the low-noise characteristic, one of the HEMT's features, will degrade.

In the conventional art, however, importance is attached to the high-speed characteristic at the sacrifice of the low-noise characteristic. For example, in the conventional compound semiconductor device shown in FIG. 9, the distance between the intrinsic InGaAs layer 103 functioning as a channel layer and the Si planar-doped layer 106 is approximately 2 to 3 nm. Thus the impurity sufficiently diffuses into the channel layer.

On the other hand, a compound semiconductor device using both a layer doped with an n-type impurity as an electron supply layer and a planar-doped layer is disclosed in Patent Document 2 (Japanese Patent Application Laid-Open No. Hei 11-214676). FIG. 10 is a cross-sectional view illustrating the structure of another conventional compound semiconductor device.

In this compound semiconductor device, an intrinsic InAlAs layer 112 is selectively formed on an InP substrate 111, and then an intrinsic InGaAs layer 113, an intrinsic InAlAs layer 114, an n-type InAlAs layer 115, a Si planar-doped layer 116, and an n-type InAlAs layer 117 are successively stacked on the intrinsic InAlAs layer 112. Then, n-type InGaAs layers 118 are formed in two places on the n-type InAlAs layer 117, and then a source electrode 119S and a drain electrode 119D are formed on the InGaAs layers 118, respectively. In addition, a gate electrode 120 is formed in an area between the source electrode 119S and the drain electrode 119D on the n-type InAlAs layer 117.

Also in this structure, however, the low-noise characteristic is sacrificed. Another problem is that the n-type InAlAs layer 117 must be thickened in order to ensure an adequate gate withstand voltage. It is thus difficult to satisfy requirements for both the gate withstand voltage and the high-speed characteristic.

This problem has not yet been solved either by the technique disclosed in Patent Document 3 (Japanese Patent Application Laid-Open No. Hei 8-55979 (Japanese Patent No. 2661555)). More particularly, although Patent Document 3 discloses the technique for forming a Si planar-doped layer on an intrinsic InAlAs layer and then an n-type InAlAs layer on the Si planar-doped layer, it is difficult to satisfy the respective characteristics.

SUMMARY OF THE INVENTION

An object of the present invention is to provide a compound semiconductor device capable of improving the gate withstand voltage while maintaining the high-speed characteristic at a high level and, preferably, also capable of improving the low-noise characteristic, and to provide a method for fabricating the compound semiconductor device.

In order to solve the above-described problems, the inventor of the present application has conceived the following embodiments of the present invention as a result of mature consideration.

A compound semiconductor device according to the present invention is provided with a channel layer and a supply layer composed of an impurity-containing compound semiconductor to supply electric charges to the channel layer. A planar-doped layer is formed on a surface of the supply layer which surface is on the side opposite to the channel layer. The compound semiconductor device is also provided with a barrier layer composed of an intrinsic compound semiconductor and disposed so as to sandwich the planar-doped layer with the supply layer, and a gate electrode disposed so as to sandwich the supply layer, planar-doped layer and barrier layer with the channel layer.

In a method for fabricating a compound semiconductor device according to the present invention, a channel layer is formed, and then a supply layer composed of an impurity-containing compound semiconductor to supply electric charges to the channel layer is formed. Next, a planar-doped layer is formed on a surface of the supply layer. Thereafter, a barrier layer composed of an intrinsic compound semiconductor is formed on the planar-doped layer. Then, a gate electrode is formed above the barrier layer.

DETAILED DESCRIPTION OF THE PREFERRED EMBODIMENTS

The embodiments of the present invention are described hereinafter with reference to the accompanying drawings.

First Embodiment

Figure 1:
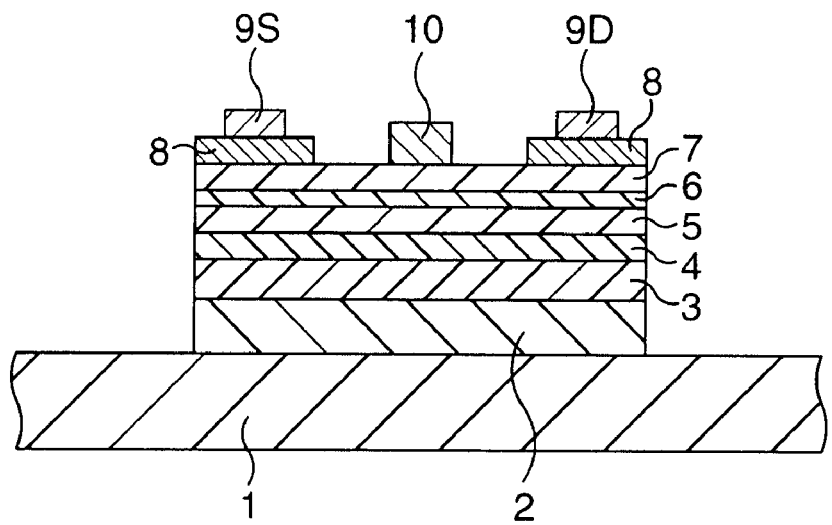
FIG. 1 is a cross-sectional view illustrating the structure of a HEMT according to a first embodiment of the present invention.

First, an explanation will be made of the first embodiment of the present invention. FIG. 1 is a cross-sectional view illustrating the structure of a HEMT according to the first embodiment of the present invention.

In the first embodiment, a buffer layer 2 is selectively formed on a semiconductor substrate 1. The semiconductor substrate 1 is, for example, an InP substrate. The buffer layer 2 is, for example, an intrinsic InAlAs layer whose thickness is 300 nm. A channel layer 3, a spacer layer 4, a supply layer of electron 5, a planar-doped layer 6 and a barrier layer 7 are formed on the buffer layer 2. The channel layer 3 is, for example, an intrinsic InGaAs layer whose thickness is 25 nm. The spacer layer 4 is, for example, an intrinsic InAlAs layer whose thickness is 3 nm. The supply layer 5 is, for example, an n-type InAlAs layer whose thickness is 4 nm. The impurity concentration (Si concentration) of this n-type InAlAs layer is, for example, $5\times10^{18}$ atoms/cm$^3$. The planar-doped layer 6 is formed, for example, by doping Si onto the surface of the supply layer 5 at a concentration of $5\times10^{12}$ atoms/cm$^2$. The barrier layer 7 is, for example, an intrinsic InAlAs layer whose thickness is 5 nm.

In addition, cap layers 8 are formed in two places on the barrier layer 7, and then a source electrode 9S and a drain electrode 9D are formed on the cap layers 8, respectively. A gate electrode 10 is formed in an area between the source electrode 9S and the drain electrode 9D on the barrier layer 7. The cap layer 8 is, for example, an n-type InGaAs layer whose thickness is 50 nm. The impurity concentration (Si concentration) of this n-type InGaAs layer is, for example, $1\times10^{19}$ atoms/cm$^3$. Both the source electrode 9S and the drain electrode 9D are configured by, for example, successively stacking a titanium (Ti) film whose thickness is 10 nm, a platinum (Pt) film whose thickness is 30 nm and a gold (Au) film whose thickness is 300 nm from the bottom. The gate electrode 10 is configured by, for example, successively stacking a Ti film whose thickness is 10, a Pt film whose thickness is 30 nm and a Au film whose thickness is 500 nm from the bottom.

In the HEMT configured as described above, the spacer layer 4 and the supply layer 5 exist between the channel layer 3 and the planar-doped layer 6, and the total thickness of these layers is approximately 7 nm. For this reason, the impurity (Si) in the planar-doped layer 6 never diffuses into the channel layer 3, thus making available an excellent low-noise characteristic. Another point to note is that simply increasing the distance between the channel layer 3 and the planar-doped layer 6 will degrade the transconductance gm. In this embodiment, however, a sufficiently high gate withstand voltage can be obtained even if the barrier layer 7 is made thinner since an intrinsic semiconductor layer is used as the barrier layer 7. It is therefore possible to cancel the degradation of the transconductance gm by thinning the barrier layer 7.

Note that in order to prevent the impurity in the planer-doped layer 6 from diffusing into the channel layer 3, the distance between these layers should preferably be at least 5 nm.

Next, an explanation will be made of a method for fabricating the HEMT according to the first embodiment. FIGS. 2A to 2G are cross-sectional views illustrating a method for fabricating the HEMT according to the first embodiment in the order of steps.

Figure 2A:
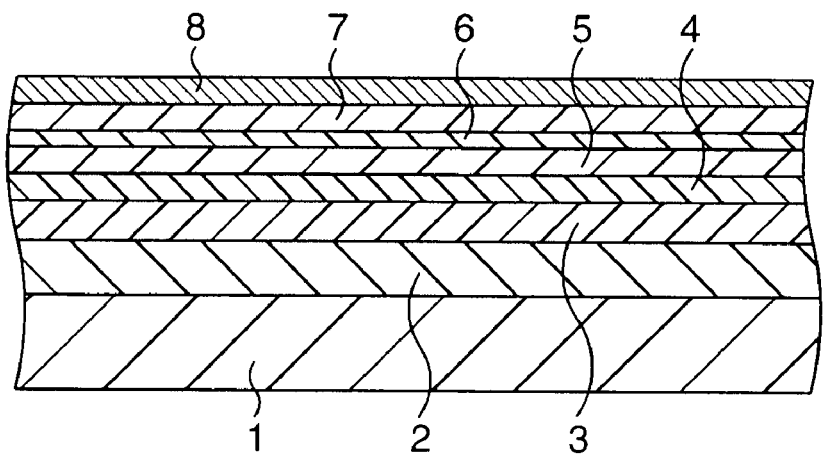
FIGS. 2A to 2G are cross-sectional views illustrating a method for fabricating the HEMT according to the first embodiment of the present invention in the order of steps.

First, as shown in FIG. 2A, the buffer layer 2 composed of intrinsic InAlAs, the channel layer 3 composed of intrinsic InGaAs, the spacer layer 4 composed of intrinsic InAlAs, and the supply layer 5 composed of n-type InAlAs are successively formed on the semiconductor substrate 1 composed of InP, for example, with an MOCVD method. Next, the planar-doped layer 6 is formed by planar-doping Si onto the surface of the supply layer 5. Then, the barrier layer 7 composed of intrinsic InAlAs and the cap layer 8 composed of n-type InGaAs are successively formed on the planar-doped layer 6, for example, with an MOCVD method.

Figure 2B:
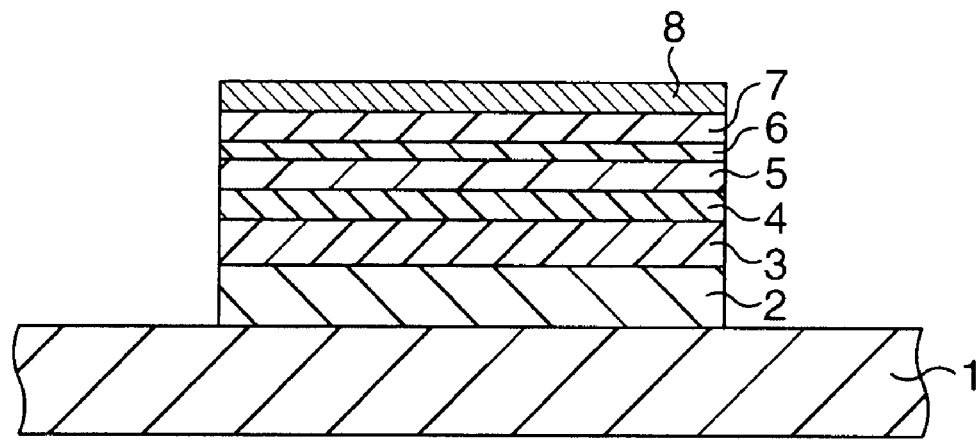

After the above-described process, a resist pattern covering an area to be left over on the laminated body consisting of the buffer layer 2, channel layer 3, spacer layer 4, supply layer of electron 5, planar-doped layer 6, barrier layer 7 and cap layer 8 is formed with a photolithography method. Then, using the resist pattern as a mask, the laminated body is wet-etched into a mesa structure as shown in FIG. 2B. Note that a mixture of, for example, phosphoric acid and hydrogen peroxide solution is used in the wet-etching. Also note that the wet-etching may be stopped when the channel layer 3 is reached, thus leaving over the entire buffer layer 2.

Figure 2C:
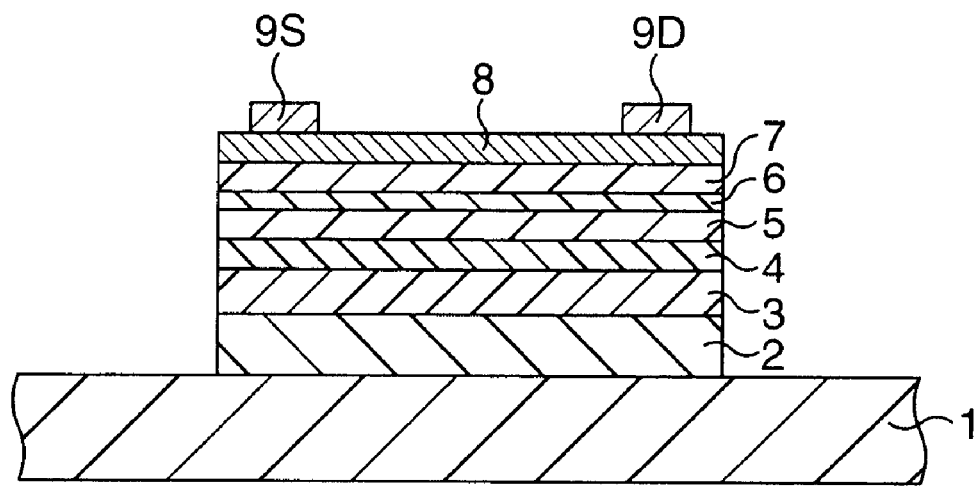

Next, as shown in FIG. 2C, the source electrode 9S and the drain electrode 9D are formed on the cap layers 8, for example, with a lift-off method. In this embodiment, a Ti film, a Pt film and a Au film, for example, are successively formed with an evaporation method.

Figure 2D:
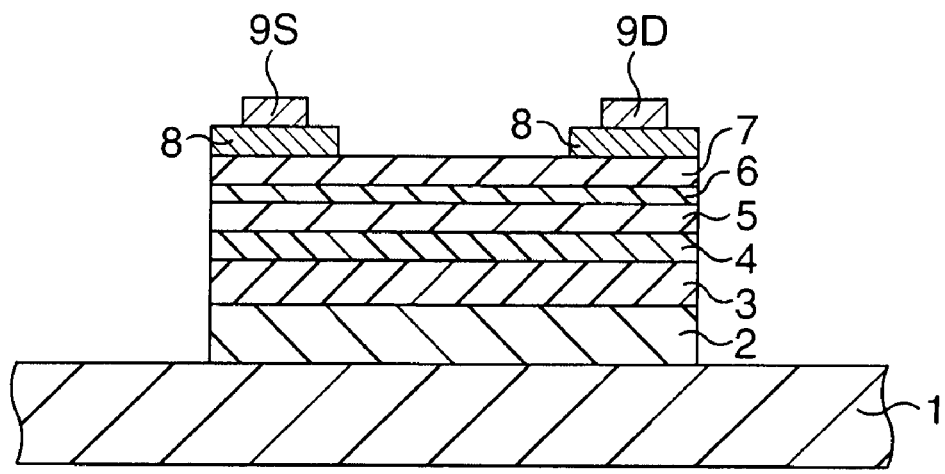

Then, a resist pattern covering an area to be left over on the cap layer 8 is formed with a photolithography method. Then, using this resist pattern as a mask, a recess portion is formed in the cap layer 8 by wet-etching the cap layer, 8, as shown in FIG. 2D. In other words, the portions underneath the source electrode 9S and drain electrode 9D are separated from each other. Note that a mixture of, for example, citric acid, hydrogen peroxide solution and water is used in this wet-etching. When this mixture is used, the selectivity difference between the cap layer 8 composed of n-type InGaAs and the barrier layer 7 composed of intrinsic InAlAs is high; therefore, etching can thus be easily stopped at the surface of the barrier layer 7.

Figure 2E:
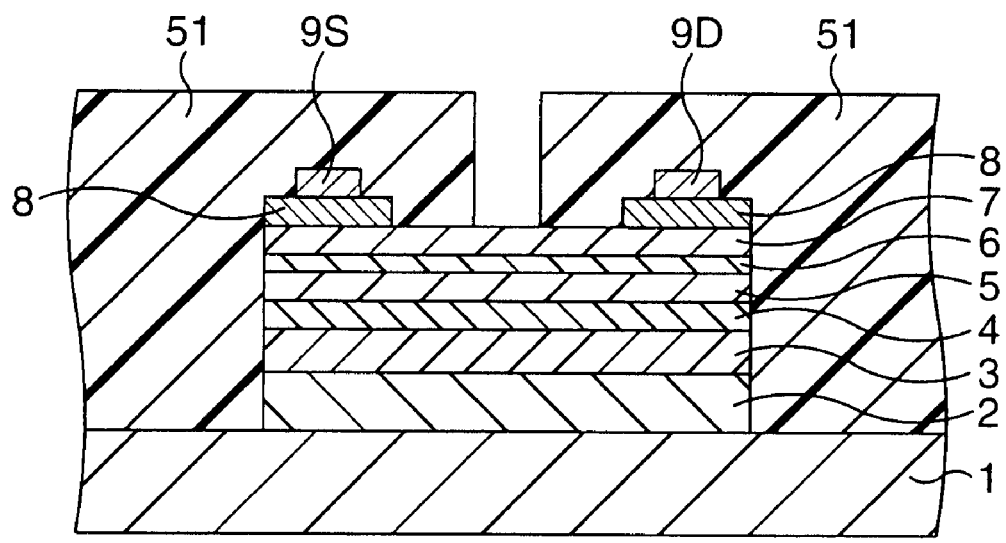

Then, a resist pattern 51 is formed so that an opening thereof is positioned in the area where the gate electrode 10 is to be formed, as shown in FIG. 2E. As the resist pattern 51, a three-layer pattern, for example, is used. In addition, the opening is formed by means of, for example, electron beam exposure when the resist pattern 51 is formed. Note that a two-layer resist pattern is formed when the source electrode 9S and drain electrode 9D are formed.

Figure 2F:
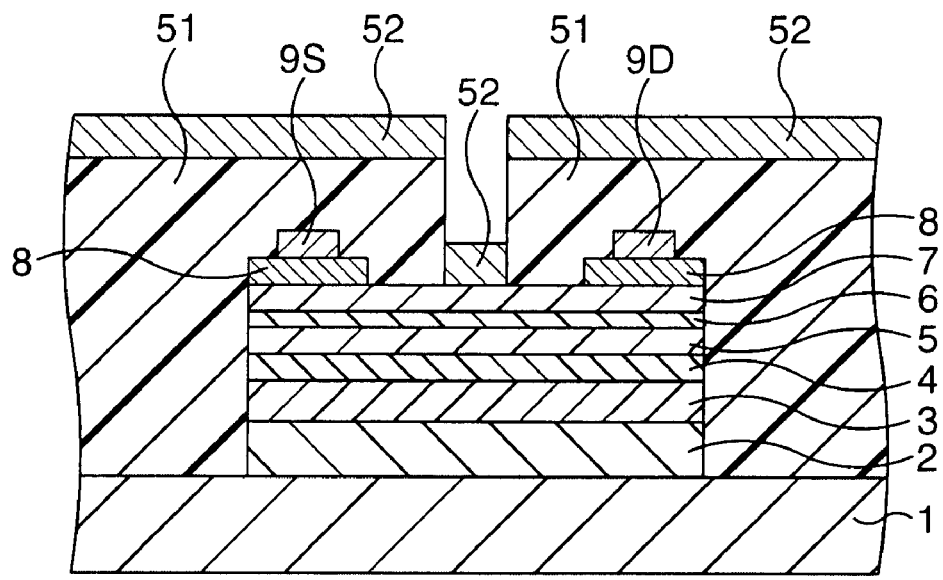

Next, a metal layer 52 is formed by successively forming a Ti film, a Pt film and a Au film, for example, with an evaporation method, as shown in FIG. 2F. Note that metal layers are formed using a similar method also when the source electrode 9S and drain electrode 9D are formed.

Figure 2G:
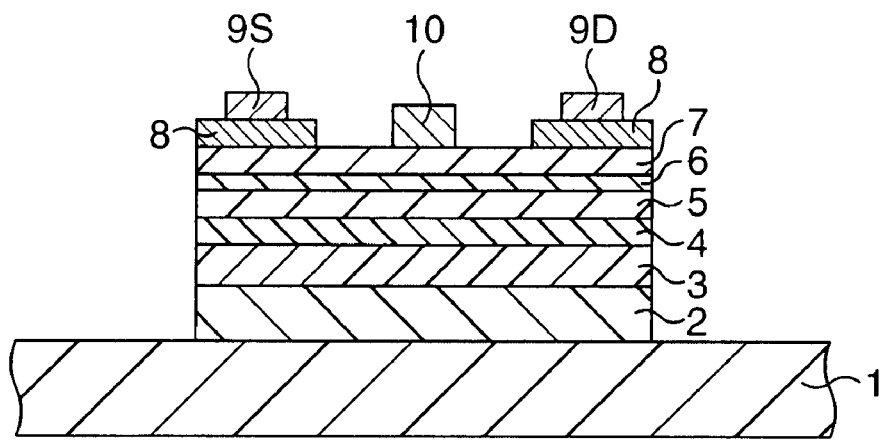

Then, the resist pattern 51 and the metal layer 52 thereon are removed. As a result, as shown in FIG. 2G, only the portion of the metal layer 52 positioned in the opening remains to serve as the gate electrode 10. In other words, the gate electrode 10 is formed with a lift-off method. Note that the resist pattern, etc. are removed with a similar method also when the source electrode 9S and drain electrode 9D are formed.

According to the above-described method, it is possible to obtain a HEMT having the structure shown in FIG. 1.

Second Embodiment

Figure 3:
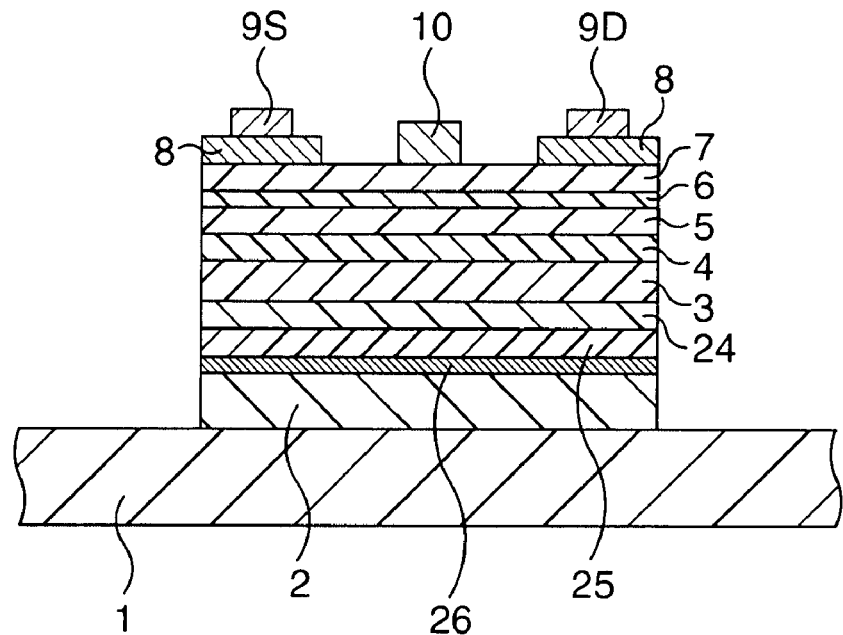
FIG. 3 is a cross-sectional view illustrating the structure of a HEMT according to a second embodiment of the present invention.

Next, an explanation will be made of the second embodiment of the present invention. FIG. 3 is a cross-sectional view illustrating the structure of a HEMT according to the second embodiment of the present invention.

In the second embodiment, a buffer layer 2 is selectively formed on a semiconductor substrate 1 as with the first embodiment. Then, a planar-doped layer 26, a supply layer of electron 25 and a spacer layer 24 are formed on the buffer layer 2. The planar-doped layer 26 is formed, for example, by doping Si onto the surface of the buffer layer 2 at a concentration of $5 \times 10^{12}$ atoms/cm². The supply layer 25 is, for example, an n-type InAlAs layer whose thickness is 4 nm. The spacer layer 24 is, for example, an intrinsic InAlAs layer whose thickness is 3 nm.

As with the first embodiment, a channel layer 3, a spacer layer 4, a supply layer of electron 5, a planar-doped layer 6 and a barrier layer 7 are formed on the spacer layer 24. In addition, as with the first embodiment, cap layers 8 are formed in two places on the barrier layer 7, and then a source electrode 9S and a drain electrode 9D are formed on the cap layers 8, respectively. A gate electrode 10 is formed in an area between the source electrode 9S and the drain electrode 9D on the barrier layer 7.

In the second embodiment configured as described above, the spacer layers 4 and 24, the supply layers 5 and 25, and the planar-doped layers 6 and 26 are symmetrically disposed across the channel layer 3. In other words, the second embodiment has a double-doped structure. For this reason, it is possible to obtain an even better transconductance gm, compared with the first embodiment. In addition, since the planar-doped layer 26 is approximately 7 nm apart from the channel layer 3, the low-noise characteristic remains excellent.

Next, an explanation will be made of a method for fabricating the HEMT according to the second embodiment. FIGS. 4A to 4G are cross-sectional views illustrating a method for fabricating the HEMT according to the second embodiment in the order of steps.

Figure 4A:
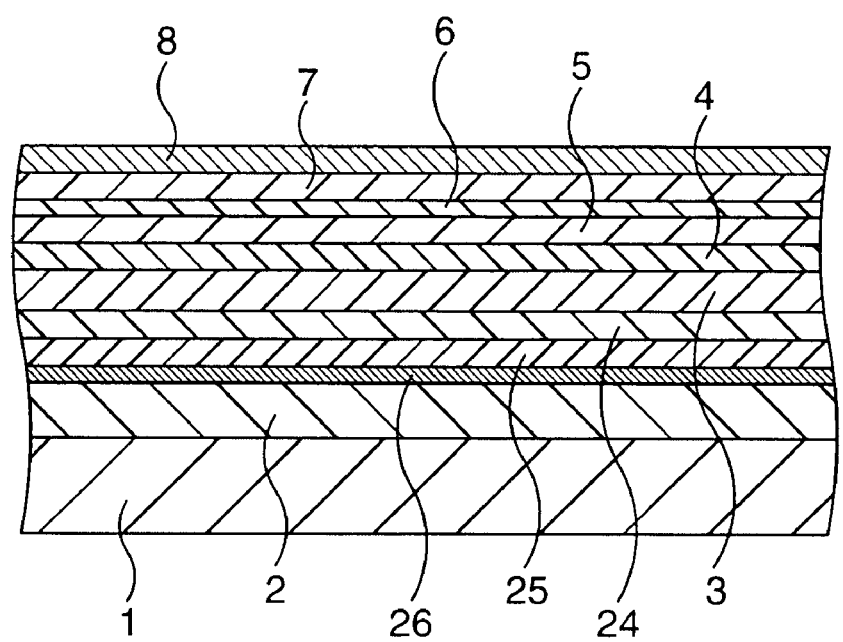
FIGS. 4A to 4G are cross-sectional views illustrating a method for fabricating the HEMT according to the second embodiment of the present invention in the order of steps.

First, as shown in FIG. 4A, the buffer layer 2 composed of intrinsic InAlAs is formed on the semiconductor substrate 1 composed of InP, for example, with an MOCVD method. Next, the planar-doped layer 26 is formed by planar-doping Si onto the surface of the buffer layer 2. Then, the supply layer 25 composed of n-type InAlAs, the spacer layer 24 composed of intrinsic InAlAs, the channel layer 3 composed of intrinsic InGaAs, the spacer layer 4 composed of intrinsic InAlAs, and the supply layer 5 composed of n-type InAlAs are successively formed on the planar-doped layer 26, for example, with an MOCVD method. Next, the planar-doped layer 6 is formed by planar-doping Si onto the surface of the supply layer 5. Then, the barrier layer 7 composed of intrinsic InAlAs and the cap layer 8 composed of n-type InGaAs are successively formed on the planar-doped layer 6, for example, with an MOCVD method.

Figure 4B:
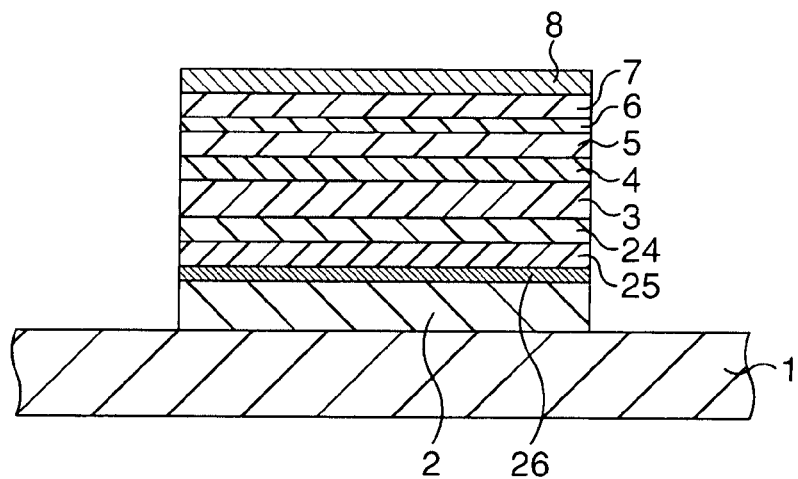

After the above-described process, a resist pattern covering an area to be left over on the laminated body consisting of the buffer layer 2, planar-doped layer 26, supply layer of electron 25, spacer layer 24, channel layer 3, spacer layer 4, supply layer of electron 5, planar-doped layer 6, barrier layer 7 and cap layer 8 is formed with a photolithography method. Then, as shown in FIG. 4B, the laminated body is wet-etched into a mesa structure using the resist pattern as a mask. Note that the wet-etching may be stopped when the planar-doped layer 26 is reached, thus leaving over the entire buffer layer 2.

Figure 4C:
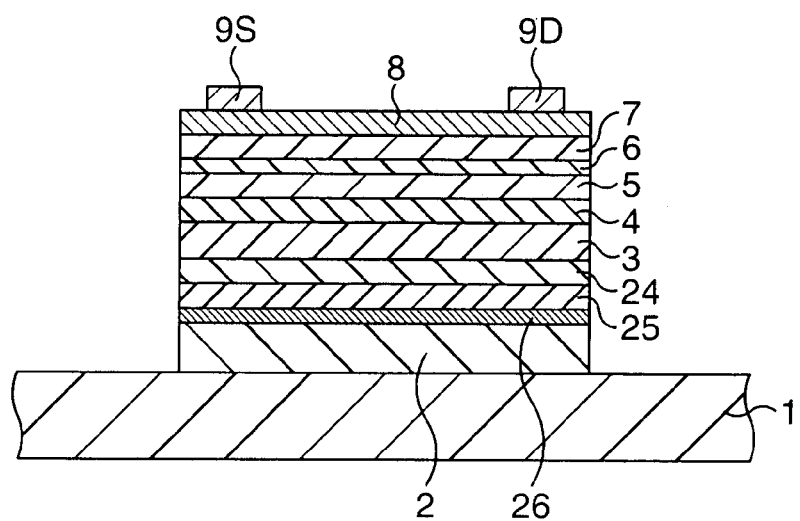

Next, as shown in FIG. 4C, the source electrode 9S and the drain electrode 9D are formed on the cap layers 8, for example, with a lift-off method. Also in this embodiment, a Ti film, a Pt film and a Au film, for example, are successively formed with an evaporation method.

Figure 4D:
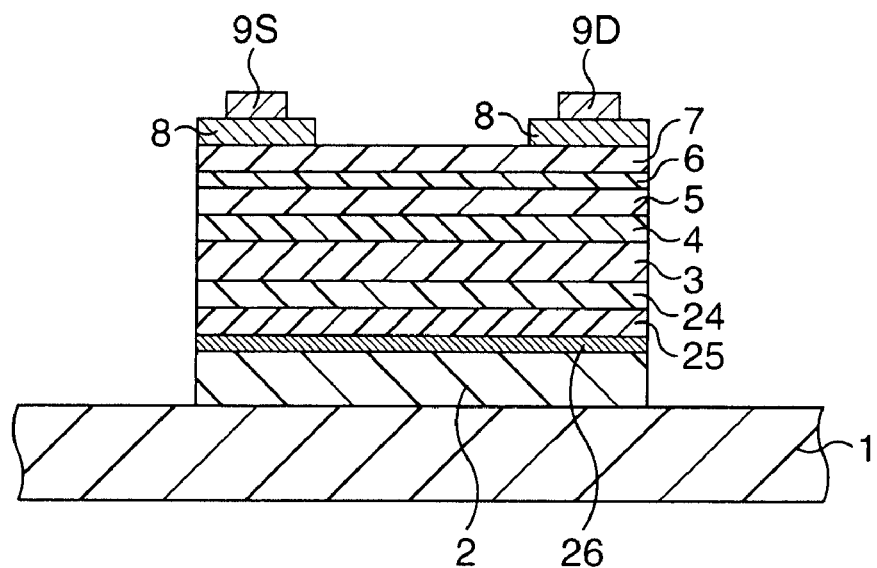

Then, a resist pattern covering an area to be left over on the cap layer 8 is formed with a photolithography method. Then, using this resist pattern as a mask, a recess portion is formed in the cap layer 8 by wet-etching the cap layer 8, as shown in FIG. 4D. In other words, the portions underneath the source electrode 9S and drain electrode 9D are separated from each other.

Figure 4E:
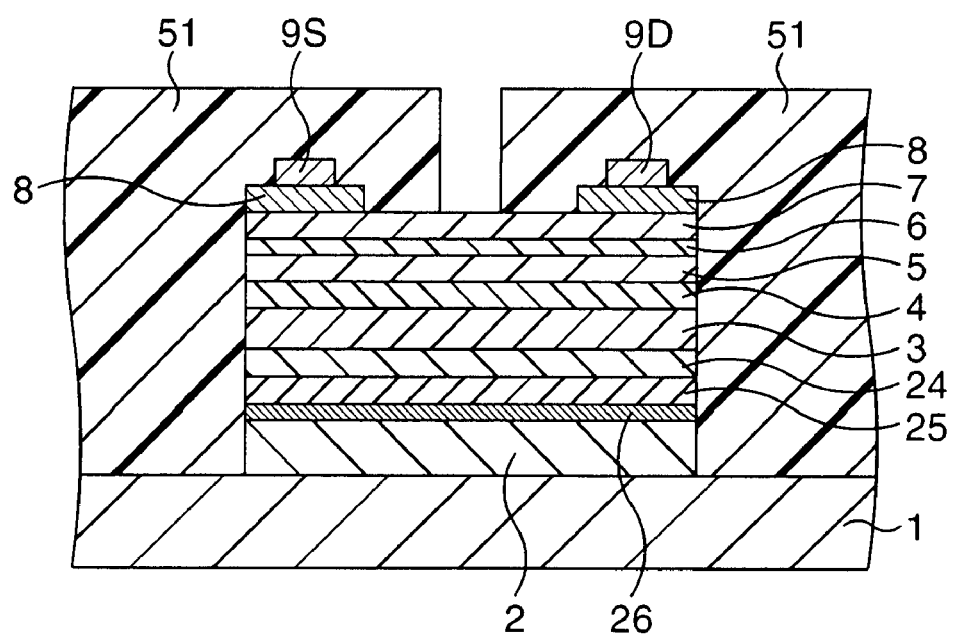

Then, a resist pattern 51 is formed so that an opening thereof is positioned in the area where the gate electrode 10 is to be formed, as shown in FIG. 4E. The opening is formed by means of, for example, electron beam exposure when the resist pattern 51 is formed.

Figure 4F:
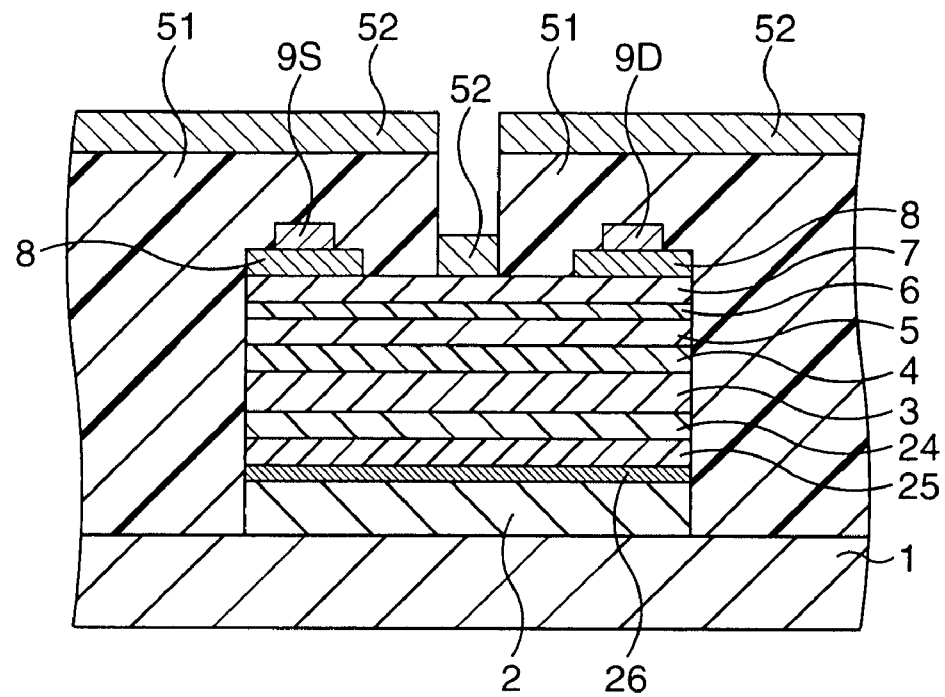

Next, a metal layer 52 is formed by successively forming a Ti film, a Pt film and a Au film, for example, with an evaporation method, as shown in FIG. 4F.

Figure 4G:
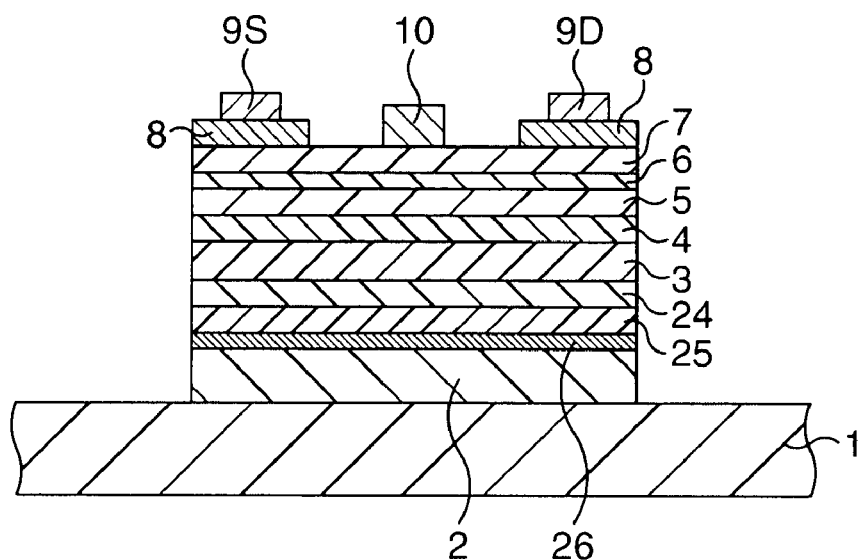

Then, the resist pattern 51 and the metal layer 52 thereon are removed. As a result, as shown in FIG. 4G, only the portion of the metal layer 52 positioned in the opening remains to serve as the gate electrode 10. In other words, the gate electrode 10 is formed with a lift-off method.

According to the above-described method, it is possible to obtain a HEMT having the structure shown in FIG. 3.

Third Embodiment

Figure 5:
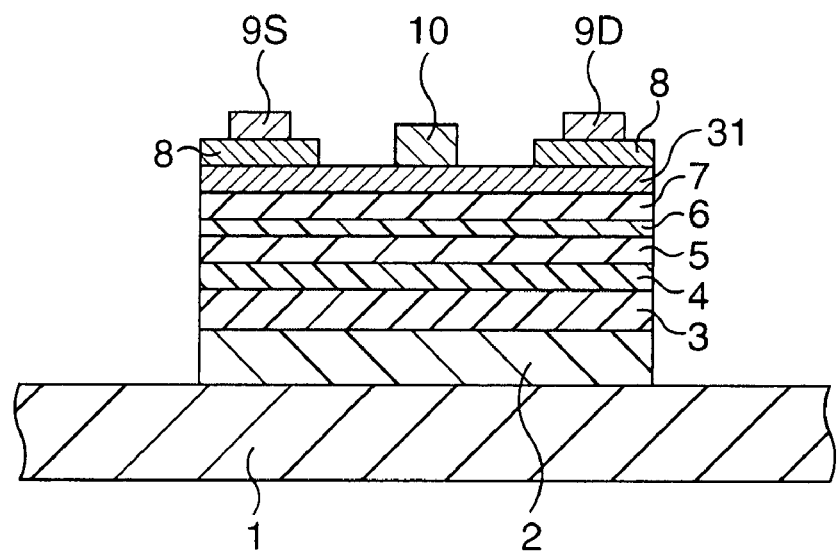
FIG. 5 is a cross-sectional view illustrating the structure of a HEMT according to a third embodiment of the present invention.

Next, an explanation will be made of the third embodiment of the present invention. FIG. 5 is a cross-sectional view illustrating the structure of a HEMT according to the third embodiment of the present invention.

In the third embodiment, a stopper layer 31 is formed on a barrier layer 7, and cap layers 8 are formed in two places on the stopper layer 31. The stopper layer 31 is, for example, an intrinsic InP layer whose thickness is 5 nm. The rest of configuration is the same as that of the first embodiment.

In the fabrication process of the third embodiment as described above, the wet-etching of the cap layer 8 can be stopped in an even more appropriately manner, which will be explained later in more detail. As a result, it is possible to obtain a higher level of repeatability. This is because the selectivity difference between the cap layer 8 and the stopper layer 31 composed of intrinsic InP is by approximately one order of magnitude larger than that between the cap layer 8 and the barrier layer 7 composed of intrinsic InAlAs.

Figure 6A:
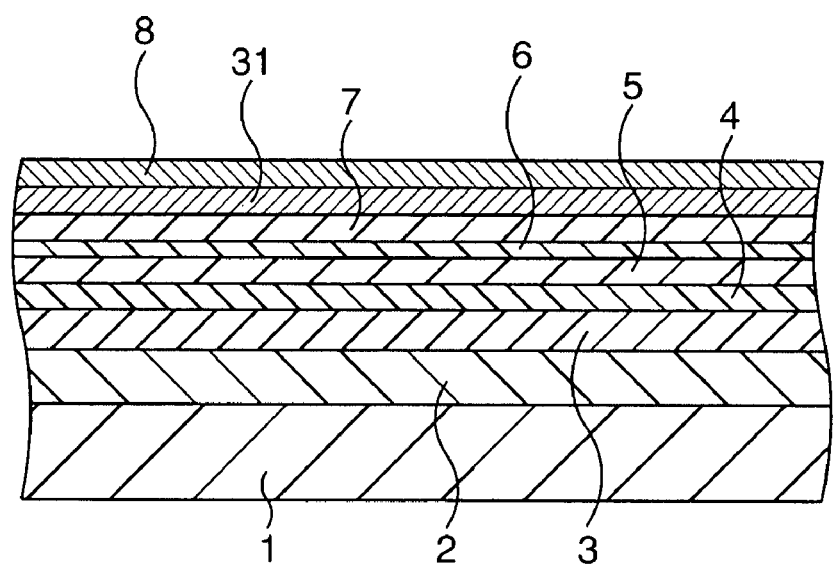
FIGS. 6A to 6C are cross-sectional views illustrating a method for fabricating the HEMT according to the third embodiment of the present invention in the order of steps.
Figure 6B:
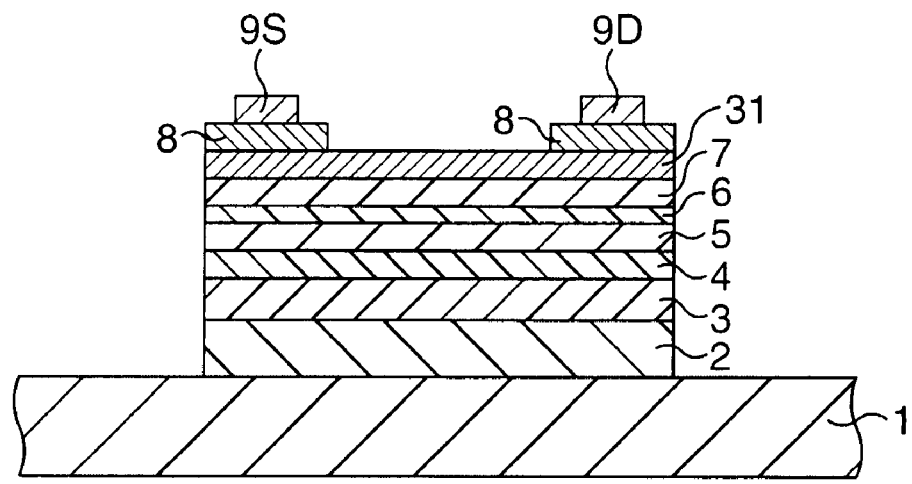
Figure 6C:
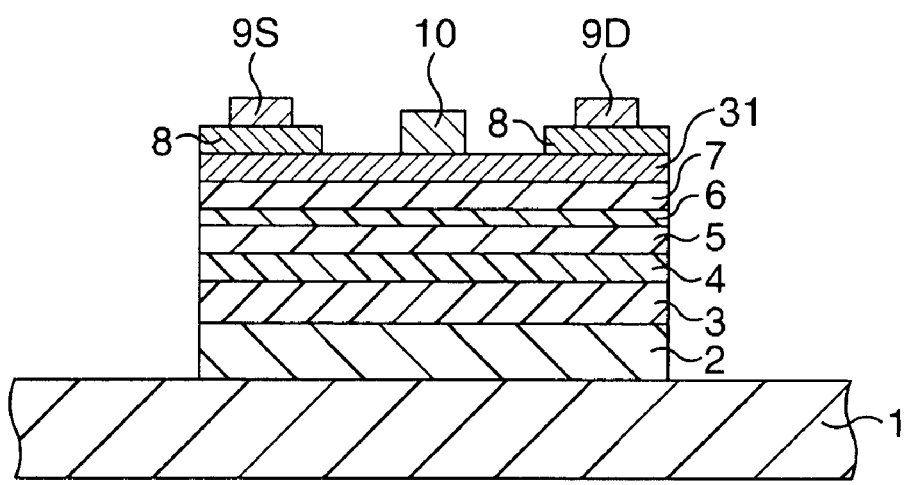

Next, an explanation will be made of a method for fabricating the HEMT according to the third embodiment. FIGS. 6A to 6C are cross-sectional views illustrating a method for fabricating the HEMT according to the third embodiment in the order of steps.

First, as shown in FIG. 6A, a buffer layer 2, a channel layer 3, a spacer layer 4, a supply layer 5, a planar-doped layer 6 and a barrier layer 7 are successively formed on a semiconductor substrate 1, for example, with an MOCVD method, as with the first embodiment. Then, the stopper layer 31 composed of intrinsic InP and the cap layer 8 composed of n-type InGaAs are successively formed on the barrier layer 7, for example, with an MOCVD method.

Then, as shown in FIG. 6B, a source electrode 9S and a drain electrode 9D are formed and a recess portion is formed in the cap layer 8 by wet-etching the cap layer 8, as with the first embodiment. In other words, the portions underneath the source electrode 9S and drain electrode 9D are separated from each other. Note that a mixture of, for example, citric acid, hydrogen peroxide solution and water is used also in the wet-etching of the present embodiment. As described above, in the present embodiment, it is possible to wet-etch the cap layer 8 at a selectivity level higher than in the first embodiment.

Then, as shown in FIG. 6C, a gate electrode 10 is formed with a lift-off method as with the first embodiment.

According to the above-described method, it is possible to obtain a HEMT having the structure shown in FIG. 5.

Fourth Embodiment

Figure 7:
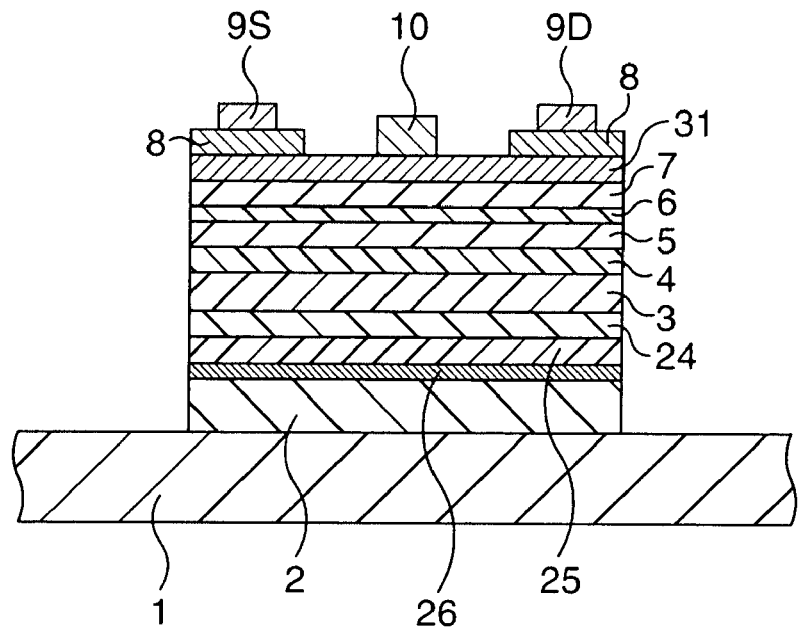
FIG. 7 is a cross-sectional view illustrating the structure of a HEMT according to a fourth embodiment of the present invention.

Next, an explanation will be made of the fourth embodiment of the present invention. FIG. 7 is a cross-sectional view illustrating the structure of a HEMT according to the fourth embodiment of the present invention.

In the fourth embodiment, a stopper layer 31 is formed on a barrier layer 7, and cap layers 8 are formed in two places on the stopper layer 31, as with the third embodiment. The stopper layer 31 is, for example, an intrinsic InP layer whose thickness is 5 nm. The rest of configuration is the same as that of the second embodiment.

Also in the fabrication process of the fourth embodiment, the wet-etching of the cap layer 8 can be stopped in an even more appropriately manner. As a result, it is possible to obtain a higher level of repeatability. This is because the selectivity difference between the cap layer 8 and the stopper layer 31 composed of intrinsic InP is by approximately one order of magnitude larger than that between the cap layer 8 and the barrier layer 7 composed of intrinsic InAlAs.

Figure 8A:
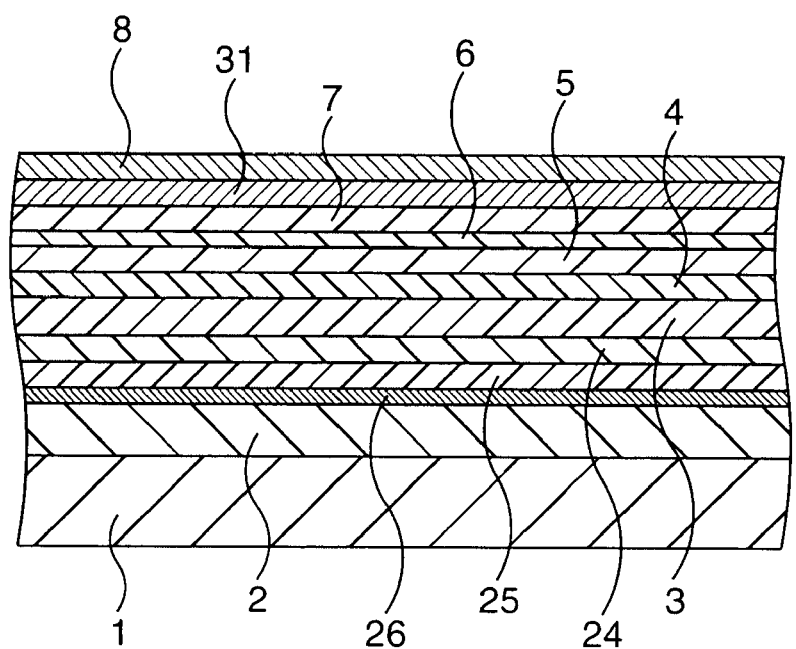
FIGS. 8A to 8C are cross-sectional views illustrating a method for fabricating the HEMT according to the fourth embodiment of the present invention in the order of steps.
Figure 8B:
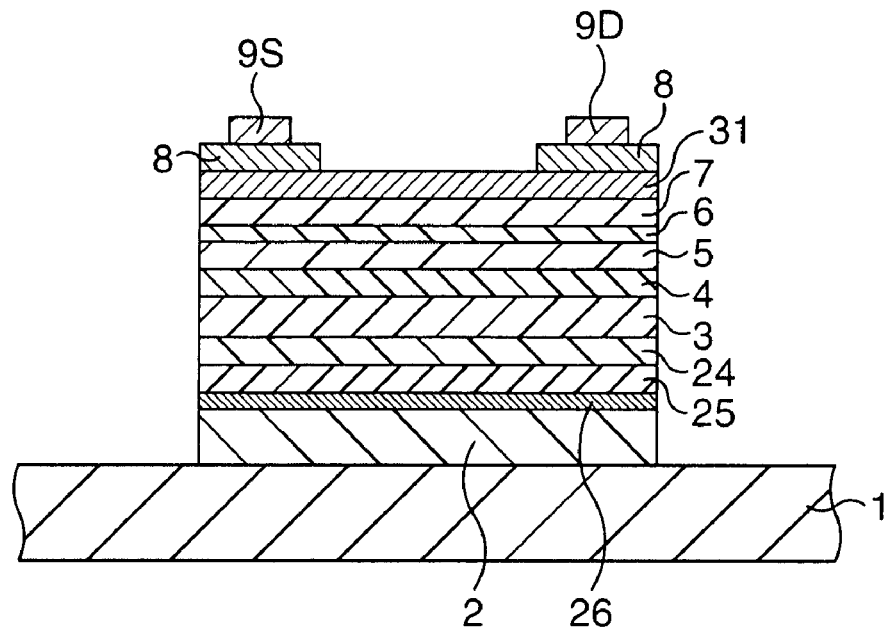
Figure 8C:
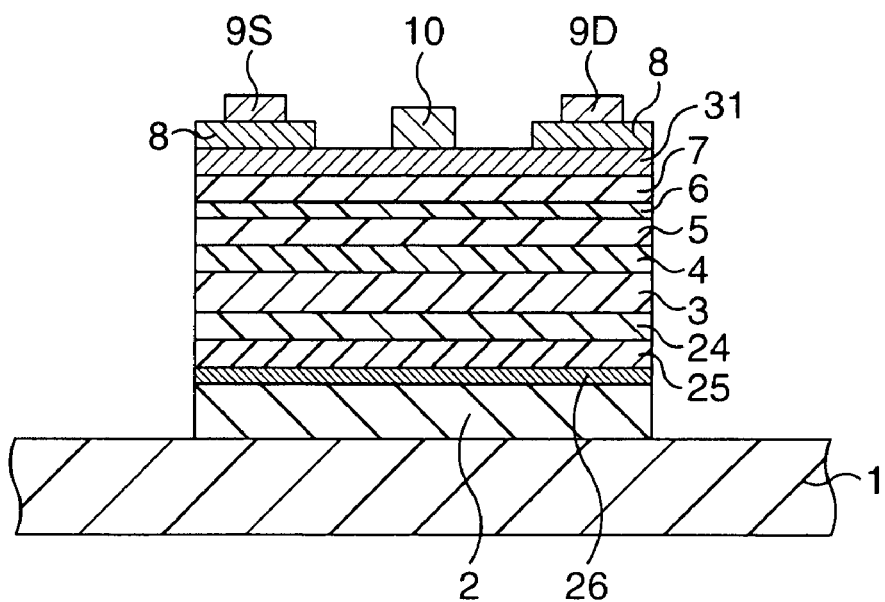
Figure 9:
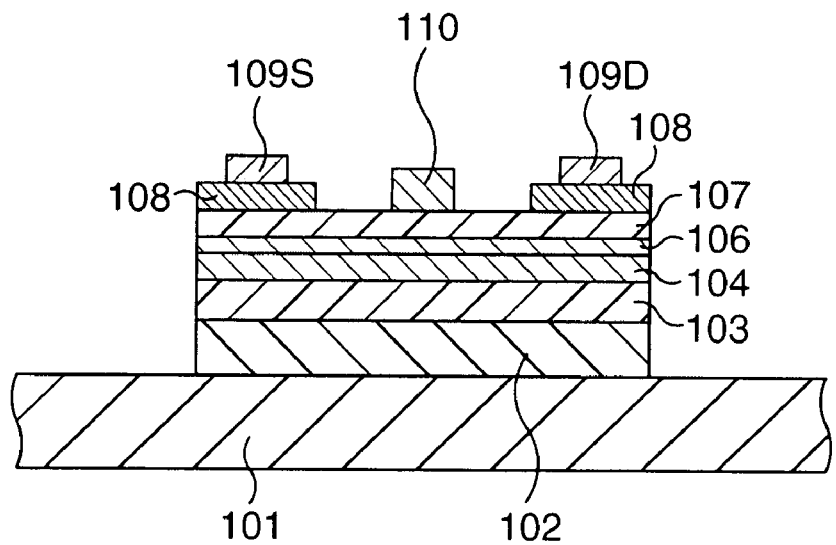
FIG. 9 is a cross-sectional view illustrating the structure of a conventional HEMT.
Figure 10:
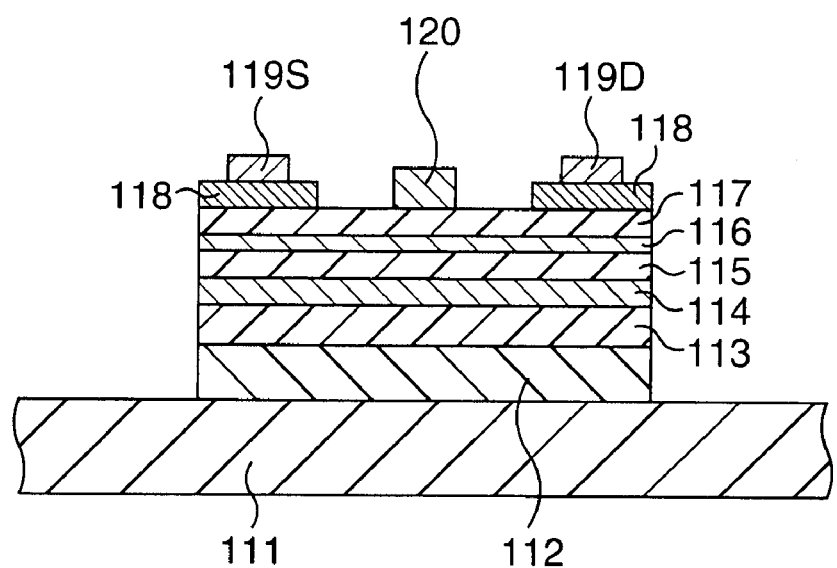
FIG. 10 is a cross-sectional view illustrating the structure of another conventional HEMT.

Next, an explanation will be made of a method for fabricating the HEMT according to the fourth embodiment. FIGS. 8A to 8C are cross-sectional views illustrating a method for fabricating the HEMT according to the fourth embodiment in the order of steps.

First, as shown in FIG. 8A, a buffer layer 2, a planar-doped layer 26, a supply layer 25, a spacer layer 24, a channel layer 3, a spacer layer 4, a supply layer 5, a planar-doped layer 6 and a barrier layer 7 are successively formed on a semiconductor substrate 1, for example, with an MOCVD method and so forth, as with the second embodiment. Next, the stopper layer 31 composed of intrinsic InP and the cap layer 8 composed of n-type InGaAs are successively formed on the barrier layer 7, for example, with an MOCVD method.

Then, as shown in FIG. 8B, a source electrode 9S and a drain electrode 9D are formed and a recess portion is formed in the cap layer 8 by wet-etching the cap layer 8, as with the second embodiment. In other words, the portions underneath the source electrode 9S and drain electrode 9D are separated from each other. Note that a mixture of, for example, citric acid, hydrogen peroxide solution and water is used also in the wet-etching of the present embodiment. As described above, in this embodiment, it is possible to wet-etch the cap layer 8 at a selectivity level higher than in the second embodiment.

Then, as shown in FIG. 8C, a gate electrode 10 is formed with a lift-off method, as with the second embodiment.

According to the above-described method, it is possible to obtain a HEMT having the structure shown in FIG. 7.

Note that although an InP-based material is used in these embodiments, a GaAs-based material may alternatively be used. In this case, a GaAs substrate is used as the semiconductor substrate 1, an intrinsic AlGaAs layer whose thickness is approximately 800 nm is formed as the buffer layer 2, an intrinsic InGaAs layer whose thickness is approximately 10 nm is formed as the channel layer 3, and intrinsic AlGaAs layers whose thicknesses are approximately 3 nm are formed as the spacer layers 4 and 24, for example. In addition, n-type AlGaAs layers with an impurity concentration (Si concentration) of $2 \times 10^{18}$ atoms/cm$^3$ whose thicknesses are approximately 40 nm are formed as the supply layers 5 and 25, an intrinsic AlGaAs layer whose thickness is approximately 4 nm is formed as the barrier layer 7, and an n-type GaAs layer with an impurity concentration (Si concentration) of $2 \times 10^{18}$ atoms/cm$^3$ whose thicknesses are approximately 50 nm is formed as the cap layer 8, for example. As the stopper layer 31, an InGaP layer for example may be used.

According to the present invention, it is possible to secure a high gate withstand voltage while supplying an adequate amount of carrier to the channel layer to maintain the high-speed characteristic at a high level since an impurity-containing supply layer is positioned on the channel layer side of the planar-doped layer, and a barrier layer composed of an intrinsic compound semiconductor is positioned on the gate electrode side. It is also possible to provide a planar-doped layer in a position from where the impurity of the planar-doped layer does not diffuse into a channel layer. In this case, an excellent low-noise characteristic can be obtained.

What is claimed is:
1. A compound semiconductor device, comprising:
a channel layer;
a supply layer composed of an impurity-containing compound semiconductor to supply electric charges to said channel layer;

a planar-doped layer formed on a surface of said supply layer which surface is on a side opposite to said channel layer;

a barrier layer composed of an intrinsic compound semiconductor and disposed so as to sandwich said planar-doped layer with said supply layer; and a gate electrode disposed so as to sandwich said supply layer, said planar-doped layer and said barrier layer with said channel layer, wherein said planar-doped layer is formed in a position from where an impurity contained in said planar-doped layer does not diffuse into said channel layer.

2. The compound semiconductor device according to claim 1, wherein a distance between said planar-doped layer and said channel layer is at least 5 nm.

3. The compound semiconductor device according to claim 1, further comprising a spacer layer composed of an intrinsic compound semiconductor and formed between said channel layer and said supply layer.

4. The compound semiconductor device according to claim 1, wherein silicon is doped into said planar-doped layer as an impurity.

5. The compound semiconductor device according to claim 1, wherein an InAlAs layer is formed as said supply layer.

6. The compound semiconductor device according to claim 1, further comprising:

a second supply layer formed in such a position as to sandwich said channel layer with said supply layer and composed of an impurity-containing compound semiconductor to supply electric charges to said channel layer; and a second planar-doped layer formed on a surface of said second supply layer which surface is on a side opposite to said channel layer.

7. The compound semiconductor device according to claim 6, wherein said second planar-doped layer is formed in a position from where an impurity contained in said second planar-doped layer does not diffuse into said channel layer.

8. The compound semiconductor device according to claim 6, wherein a distance between said second planar-doped layer and said channel layer is at least 5 nm.

9. The compound semiconductor device according to claim 6, further comprising a second spacer layer composed of an intrinsic compound semiconductor and formed between said channel layer and said second supply layer.

10. The compound semiconductor device according to claim 6, wherein silicon is doped into said second planar-doped layer as an impurity.

11. The compound semiconductor device according to claim 6, wherein an InAlAs layer is formed as said second supply layer.

12. The compound semiconductor device according to claim 1, wherein said planar-doped layer is composed of a second impurity-containing compound semiconductor, and an amount of impurity in said planar-doped layer is lower than an amount of impurity of said supply layer.

* * * * *